US010393847B2

United States Patent
Zeller (10) Patent No.: US 10,393,847 B2
(45) Date of Patent: Aug. 27, 2019

(54) METHOD AND APPARATUS FOR RECORDING CALIBRATION DATA FOR A GRAPPA MAGNETIC RESONANCE IMAGING ALGORITHM

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 100 days.

(21) Appl. No.: 15/651,272

(22) Filed: Jul. 17, 2017

(65) Prior Publication Data

US 2018/0017655 A1    Jan. 18, 2018

(30) Foreign Application Priority Data

Jul. 18, 2016   (DE) .................. 10 2016 213 042

(51) Int. Cl.
*G01V 3/00* (2006.01)
*G01R 33/58* (2006.01)
*G01R 33/483* (2006.01)
*G01R 33/561* (2006.01)

(52) U.S. Cl.
CPC ....... *G01R 33/583* (2013.01); *G01R 33/4835* (2013.01); *G01R 33/5611* (2013.01); *G01R 33/5616* (2013.01)

(58) Field of Classification Search
CPC ............. G01R 33/543; G01R 33/5659; G01R 33/3415; G01R 33/36; A61B 5/055
(Continued)

(56) References Cited

U.S. PATENT DOCUMENTS 6,697,663 B1 * 2/2004 Lin .................. A61B 6/032
378/22
8,811,694 B2 * 8/2014 Mendes ............ G01R 33/56509
382/128
(Continued)

OTHER PUBLICATIONS

Breuer et al., "General Formulation for Quantitative G-factor Calculation in GRAPPA Reconstructions," Magnetic Resonance in Medicine, vol. 62, pp. 739-746 (2009).
(Continued)

*Primary Examiner* — Walter L Lindsay, Jr.
*Assistant Examiner* — Frederick Wenderoth
(74) *Attorney, Agent, or Firm* — Schiff Hardin LLP (57) ABSTRACT

In a method and magnetic resonance (MR) apparatus for recording calibration data for establishing convolution kernels for GRAPPA algorithms for reconstruction of image data from measurement data recorded using echo planar imaging with simultaneous recording of a number of slices of a slice stack. A slice GRAPPA algorithm is used to reconstruct the image data of the individual slices and an inplane GRAPPA algorithm is used to reconstruct undersampled magnetic resonance data within the slices. In order to record the calibration data to be used for establishing the convolution kernels of the two GRAPPA algorithms, in a predetermined slice order for the slices of the slice stack, for one slice in each case, at least one segment of k-space to be sampled is read out in the readout direction for a completely sampled readout in the phase encoding direction, and at least one such segment extends around the center of k-space in the readout direction, and the segment width is selected so that the phase encoding bandwidth matches that of the recording of the measurement data.

11 Claims, 3 Drawing Sheets

(58) Field of Classification Search
USPC .................................................. 324/309
See application file for complete search history.

(56) References Cited

U.S. PATENT DOCUMENTS

| | | | |
|---|---|---|---|
| 2008/0116891 A1* | 5/2008 | van der Kouwe ... | G01R 33/561 324/312 |
| 2012/0002858 A1* | 1/2012 | Huang ............... | G01R 33/5611 382/131 |
| 2014/0247046 A1 | 9/2014 | Grinstead | |
| 2015/0293197 A1* | 10/2015 | Taniguchi ............ | G01R 33/543 324/309 |
| 2015/0323634 A1* | 11/2015 | Polimeni .......... | G01R 33/56509 324/309 |
| 2016/0169999 A1* | 6/2016 | Herza .................... | A61B 5/055 600/411 |
| 2017/0074960 A1 | 3/2017 | Bhat et al. | |

OTHER PUBLICATIONS

Griswold et al., "Autocalibrated coil sensitivity estimation for parallel imaging," NMR in Biomedicine, vol. 19, pp. 316-324 (2006).

Setsompop et al., "Blipped-Controlled Aliasing in Parallel Imaging for Simultaneous Multislice Echo Planar Imaging with Reduced g-Factor Penalty," Magnetic Resonance in Medicine, vol. 67, pp. 1210-1224 (2012).

Polimeni et al., "Reducing Sensitivity Losses Due to Respiration and Motion in Accelerated Echo Planar Imaging by Reordering the Autocalibration Data Acquisition," Magnetic Resonance in Medicine, vol. 75, pp. 665-679 (2016).

Porter et al., "High Resolution Diffusion-Weighted Imaging Using Readout-Segmented Echo-Planar Imaging, Parallel Imaging and a Two-Dimensional Navigator-Based Reacquisition," Magnetic Resonance in Medicine, vol. 62, pp. 468-475 (2009).

Polimeni et al., "Characterization of autocalibration methods for accelerated EPI reconstructions using GRAPPA," Proc. Intl. Soc. Mag. Reson. Med., vol. 22, p. 4397 (2014).

Bhat et al., "Motion Insensitive ACS Acquisition Method for in-plane and Simultaneous Multi-Slice Accelerated EPI," Proc. Intl. Soc. Mag. Reson. Med., vol. 22, p. 0644 (2014).

Skare et al., "Clinical Multishot DW-EPI Through Parallel Imaging With Considerations of Susceptibility, Motion, and Noise," Magnetic Resonance in Medicine, vol. 57, pp. 881-890 (2007).

Baron et al., "Motion Robust GRAPPA for Echo-Planar Imaging," Magnetic Resonance in Medicine, vol. 75, pp. 1166-1174 (2016).

* cited by examiner

METHOD AND APPARATUS FOR RECORDING CALIBRATION DATA FOR A GRAPPA MAGNETIC RESONANCE IMAGING ALGORITHM

BACKGROUND OF THE INVENTION

Field of the Invention

The invention concerns a method for recording calibration data used for establishing convolution kernels for GRAPPA (GeneRalized Autocalibrating Partial Parallel Acquisition) algorithms for reconstruction of magnetic resonance data from measurement (raw) data with a magnetic resonance scanner, wherein the measurement data are recorded using an echo planar imaging magnetic resonance sequence with simultaneous recording of a number of slices of a slice stack, and the slice GRAPPA algorithm is used for reconstruction of the magnetic resonance data of the individual slices, and an inplane GRAPPA algorithm is used for reconstruction of undersampled magnetic resonance data within the slices. The invention also concerns a magnetic resonance apparatus and an electronically-readable data storage medium for implementing such a method.

Description of the Prior Art

Magnetic resonance imaging has proven to be a valuable and useful tool for medical applications. A fundamental problem of magnetic resonance imaging, however, is that magnetic resonance recordings usually take a long time. In order to make faster imaging possible, and thus to be able to show physiological processes within the examination object, which change over time, with a suitable time resolution, various possibilities for accelerated imaging have been proposed. An example of cases in which accelerated imaging methods are used is Echo Planar Imaging (EPI). In an article by K. Setsompop et al., "Blipped-Controlled Aliasing in Parallel Imaging for Simultaneous Multislice Echo Planar Imaging with Reduced g-Factor Penalty", Magnetic Resonance in Medicine 67: 1210-1224 (2012) it is proposed, in addition to the already-faster echo planar imaging, also to use parallel imaging, in order to reduce the recording time, in this context for diffusion imaging for example. Such multislice imaging is frequently abbreviated as SMS for "Simultaneous Multi-Slice". If an undersampling within the slices and a simultaneous recording of a number of slices of a slice stack are combined in this way, ultimately two algorithms are needed in order to derive magnetic resonance data from the measurement data. The data of the individual slices must be extracted from the totality of measurement data acquired during multislice imaging, since the data for individual slices are actually recorded overlaid, and missing magnetic resonance data, which are absent because of the undersampling within a slice (inplane), must be obtained from the magnetic resonance data of the slices. During the reconstruction of magnetic resonance data acquired with undersampling in a slice, the use of GRAPPA algorithms has long been known (inplane GRAPPA algorithm), as described, for example, in the above-cited Setsompop article. As described therein, GRAPPA algorithms can also be used in multislice imaging for extraction of the magnetic resonance data of the individual, simultaneously recorded slices (slice GRAPPA algorithm), since GRAPPA deconvolution kernels can be established, which are used for the extraction of magnetic resonance data for the individual slices of the simultaneously recorded slices.

Calibration data are needed in order to establish the deconvolution kernels for the GRAPPA algorithms, which in the case of the slice GRAPPA algorithm, does not reproduce the slices to be recorded simultaneously overlaid, and in the case of the inplane GRAPPA algorithm, reproduces the corresponding slice higher sampling, at least in the region of the k-space center. For echo planar imaging, for which a maximum acceleration of the recording of the measurement data is required, this calibration data are established in one or more preliminary reference scans. In such cases, two significant hurdles occur. One of these hurdles is that the phase encoding bandwidth during the recording of the calibration data must correspond as exactly as possible to the phase encoding bandwidth during the subsequent recording of the diagnostic measurement data, in order to obtain comparable geometrical distortions. If the geometrical distortions differ in the two recording processes, a reconstruction of the magnetic resonance image is possible only with reduced image quality. For example, in the case of a recording process accelerated by a factor of two, the phase encoding bandwidth is already twice as high as for non-accelerated recording processes, since the echo train is only half as long (the phase encoding bandwidth can be calculated as PBW=1/(echo spacing)*number of recorded phase encoding lines). The second problem that might be present is patient movements, which can occur between the recording of the calibration data and the measurement data, as well as during the recording of the calibration data. Such movements cause an inconsistency of the data and can thus lead to lower-quality deconvolution kernels.

A number of options have been proposed for carrying out the recording of the calibration data in such reference scans. For inplane GRAPPA algorithms, the trivial option is to record a completely sampled reference scan for calibration of undersampled recording processes. In this case, however, a match between the geometrical distortions is not achieved, so that the image quality can be worsened.

In an article by S. Skare et. al., "Clinical Multishot DW-EPI Through Parallel Imaging With Considerations of Susceptibility, Motion, and Noise", Magnetic Resonance in Medicine 57: 881-890 (2007), it is proposed for the calibration data to be recorded in a nested manner in relation to the phase encoding direction in a number of shots, which are separated by a relaxation time TR. In an example of triple undersampling, an echo train/shot is thus used for recording the calibration data, which records every third k-space row, beginning with the first row, while the second echo train begins with the second row and the third echo train with the third row. In this way, a high signal-to-noise ratio of the calibration data and a match between the geometrical distortions is made possible. A disadvantage, however, is that the recording time is long, thereby giving "extra" time in which movement of the patient can occur, and physiological effects can lead to artifacts in the magnetic resonance data.

As an alternative, it has also been proposed for the calibration data to be recorded in a reference scan using a gradient echo sequence (GRE sequence). Although a GRE sequence can be executed extremely quickly, and so is not subject to movement in the recording region to such an extent as EPI, a GRE sequence still does not allow any matching of the geometrical distortions. In this regard, reference is made to the article by Mark A. Griswold et. al., "Autocalibrated coil sensitivity estimation for parallel imaging", NMR in Biomedicine 19: 316-324 (2006), and Jonathan Rizzo Polimeni et. al., "Characterization of autocalibration methods for accelerated EPI reconstructions using GRAPPA", Proc. Intl. Soc. Mag. Reson. Med. 22: 4397 (2014).

Finally, with regard to recording of calibration data for inplane GRAPPA algorithms, it has also been proposed to record the calibration data in nested form, but with all nestings per slice being recorded in the phase encoding direction adjacent to one another in time. Such a procedure is described in Polimeni et. al. "Reducing Sensitivity Losses Due to Respiration and Motion in Accelerated Echo Planar Imaging by Reordering the Autocalibration Data Acquisition", Magnetic Resonance in Medicine 75:665-679 (2016). This method of operation is also referred to as FLEET. It has the advantage that the geometrical distortions can be matched to one another and the sensitivity to movement is reduced, but it has the disadvantage that the signal-to-noise ratio is low and preparatory scans are required because of saturation effects due to the short repetition time.

For the combination of inplane GRAPPA and slice GRAPPA, it has been proposed for one of the aforementioned methods for inplane GRAPPA to be combined with a separate, undersampled slice GRAPPA calibration scan, since for establishing the convolution kernels for the slice GRAPPA algorithm, no completely sampled slice information is then required. In this way the calibration data for the inplane GRAPPA algorithm and the slice GRAPPA algorithm are established in completely separate recording processes. Good slice GRAPPA calibration results are thus achieved, but because of the two recording processes, a long overall recording time for the calibration data is produced, thus also an increased probability of a movement of the patient in the recording region during the recording of the calibration data.

Furthermore modified FLEET variants have also been proposed, e.g. the recording of layers, which are to be recorded simultaneously at a later point in time, close to one another during the FLEET reference scan. This variant has the advantage that it is less susceptible to movements in the recording region and to physiological effects, but disadvantageously a lower signal-to-noise ratio is produced in the reference scan, so that frequently slice crosstalk artifacts occur in the magnetic resonance data. In this context, reference is made to the publication by H. Bhat in ISMRM 2014, Abstract 644.

In another modified FLEET variant, slices, which are to be recorded simultaneously later, are recorded almost simultaneously in the reference scan, by using simultaneous echo refocusing (SER). This approach is also less susceptible in relation to movements in the recording region and to physiological effects, but possibly exists for crosstalk effects to occur in SER, since the calibration data for individual slices could include radio-frequency k-space contributions of other slices.

Only recently, in an article by C. Baron and C. Beaulieu, "Motion Robust GRAPPA for Echo-Planar Imaging", Magnetic Resonance in Medicine 75:1166-1174 (2016), a new method for inplane GRAPPA calibration has been proposed, wherein the calibration data are established in the readout direction with reduced resolution. To this end, k-space that is to be read out (filled) is subdivided into segments in the readout direction, which are read out one after the other, so that shorter readout times, thus readout gradients, are produced. This allows the phase encoding bandwidth to be adapted to the phase encoding bandwidth during the recording of the measurement data. In the phase encoding direction, by contrast, a complete sampling of k-space to be read out is proposed.

SUMMARY OF THE INVENTION

An object of the present invention is to reduce the recording time for calibration data during simultaneous multislice imaging (SMS).

This object is achieved starting from a method of the type initially described but wherein, in accordance with the invention, for recording the calibration data to be used for establishing the convolution kernels of the two GRAPPA algorithms in a predetermined slice order for the slices of the slice stack, for one slice in each case, at least one segment of k-space to be scanned for recording the measurement data is read out in the readout direction during fully sampled reading out in the phase encoding direction. Additionally in accordance with the invention, at least one of the at least one segments extends around the k-space center in the readout direction, and the segment width is selected so that the phase encoding bandwidth corresponds to that of the recording of the measurement data.

Therefore, in accordance with the invention, the reference scan for recording the calibration data is carried out with a reduced readout matrix, and thus an appropriate phase encoding bandwidth, in order to obtain calibration data that are suitable both for establishing deconvolution kernels for an inplane GRAPPA algorithm as well as a slice GRAPPA algorithm during simultaneous multislice recording. Thus the approach of readout segmentation and adapted phase encoding bandwidth is expanded to the slice GRAPPA calibration so that, overall, an extremely fast, movement-insensitive reference scan is produced, which delivers calibration data with a high signal-to-noise ratio.

It should be noted that a segment in the readout direction does not encompass the entirety of k-space to be sampled, so it is conceivable that a number of segments that are mutually overlapping, at least in a small region, can be helpful when assembling the calibration data of different segments.

Different embodiments exist with regard to the slice order for the reference scan.

In a first embodiment of the inventive method, the slice order can be selected as spatially consecutive slices of the slice stack, beginning on one side of the slice stack. In order to avoid different contrasts in the slices as a result of pre-saturation effects of adjoining slices, preliminary data are acquired, before the recording of the first calibration data, from at least two neighboring slices of the first slice to be recorded, so that a state of equilibrium is established. The preliminary data are subsequently discarded. Expediently a set of N slices of the slice stack, which are adjacent to the first slice of the slice stack to be recorded in the reference scan, thus can be recorded before the reference scan, in order to obtain the same state of equilibrium (steady state) for all slices recorded in the reference scan. The preliminary data are not used in the calibration process. In this way, an extremely fast reference scan is achieved, since all of the calibration data for one slice can be recorded in a single repetition, i.e. with one repetition time, at least if only one segment is considered in the readout direction.

In a preferred, second embodiment of the inventive method, the slice order is selected so that, during the recording of the measurement data, slices recorded simultaneously are recorded immediately after one another. This means that slices of the slice stack that are to be recorded simultaneously in the later imaging scan, are also recorded adjacently in the slice order in the reference scan, which can be compared, for example, with the expanded FLEET approaches, as discussed above. In such cases, in order to establish a steady state in the slice stack before recording of the first calibration data, a preliminary scan can optionally be implemented, which provides at least one item of preliminary data relating to the slice stack as a whole. The at least one preliminary scan, which can also be referred to as a dummy scan, conducted for the entire slice stack, so that a reliable steady state can be insured even with jumps that occur during the recording because of the slices to be recorded simultaneously. The second embodiment has the advantage of being extremely insensitive to movement in the recording region, since movement between the immediately consecutive recording processes for the slices to be recorded later simultaneously is extremely unlikely. Although the preliminary scans can result in a lengthening of the recording time, the second embodiment is still far faster than, for example, the FLEET method in the prior art, since fewer repetitions are needed.

While trapezoidal readout gradient pulses are used in the reference scan in the article by Baron and Beaulieu cited above, in practice other pulses are able to be used, provided the phase encoding bandwidth is adapted to the recording process of the measurement data. Thus a trapezoidal or a sinusoidal readout gradient pulse can be used for recording the calibration data. The echo train, which is described in the aforementioned article by Baron and Beaulieu, essentially corresponds to the readout shot used in the RESOLVE method, cf. the article by David A. Porter and Robin M. Heidemann, "High Resolution Diffusion-Weighted Imaging Using Readout-segments Echo-Planar Imaging, Parallel Imaging and a Two-Dimensional Navigator-Based Reacquisition", Magnetic Resonance in Medicine 62: 468-475 (2009). In this article, sinusoidal readout gradient pulses are also proposed, which can also be used expediently in the inventive method.

In a further embodiment of the present invention, even in the phase encoding direction, only a portion (fraction) of the entire k-space surrounding the k-space center is sampled for recording the calibration data to be sampled in the phase encoding direction. This means that the amount of calibration data in the phase encoding direction can also be restricted by a segmentation, in order to not have to acquire the entirety of k-space to be sampled in the phase encoding direction, and thus accelerating the recording of the calibration data even further. This is possible because usually a low-resolution calibration data set is sufficient both for the inplane GRAPPA calibration and for the slice GRAPPA calibration. Within the portion of the phase encoding direction that includes the center of k-space, no undersampling takes place, meaning that each k-space row is read out (completely filled with data), but this is done in the readout direction restricted to the corresponding segment.

Preferably, particularly when a gradient echo sequence is used as the magnetic resonance sequence for recording the measurement data, calibration data are likewise recorded for at least two neighboring segments in the readout direction adjacent to the segment surrounding the center of k-space. At least for spin-echo EPI, usually one segment in the readout direction centered around the center of k-space is sufficient. With gradient echo EPI, however, it is expedient to use a number of segments, since k-space signals from regions with basic field inhomogeneities can be displaced to outside of the k-space regions covered by the central segment. In order to counteract these effects, a number of segments around the center of k-space can be scanned, but it should be noted that this is not absolutely necessary. This is because the aforementioned displacement by basic magnetic field inhomogeneities (B0 inhomogeneities) can also be compensated with other methods that can be employed in the inventive method.

In another embodiment of the invention, if a recalibration criterion describing a movement of a patient to be recorded is fulfilled during the recording of the measurement data, new calibration data are recorded and the convolution kernels are updated. Since the recording of the calibration data can be realized extremely quickly with the use of inventive method, recalibration processes are possible during the recording of the measurement data, in order to further improve the data quality of the magnetic resonance data and of magnetic resonance images resulting therefrom. Particularly when the reference scan, because of the use of only one segment, is possible for each of the slices within a single repetition, such a recalibration during longer scan sessions makes sense. For example, the patient or the recording region can be monitored for movement, so that if, in a long-lasting diffusion scan taking 15 minutes, for example, a movement is observed at a point in time, such as after seven minutes, there can be a recalibration.

The present invention also encompasses a magnetic resonance apparatus having a control computer configured to carry out the inventive method. In this case, the control computer can have a recording parameter establishment processor for the reference scan, in which, depending on the known recording parameters for the measurement data, the recording parameters for the reference scan are established, in particular the at least one segment and its extent as well as the slice order. A sequence controller of the control computer is configured, to use these recording parameters to implement the reference scan. This takes place by further components of the scanner of the magnetic resonance apparatus being activated, namely the radio-frequency (RF) coil arrangement and the gradient coil arrangement, in order to emit corresponding pulses. All statements made with regard to the inventive method are applicable to the inventive magnetic resonance apparatus, so the aforementioned advantages are also be obtained with the apparatus.

The present invention also encompasses a non-transitory, computer-readable data storage medium that is loadable into a control computer or computer system of a magnetic resonance apparatus, and the programming instructions cause the control computer or computer system to operate the magnetic resonance apparatus in order to implement any or all of the embodiments of the inventive method as described above.

The data storage medium can be, for example a CD-ROM.

DESCRIPTION OF THE PREFERRED EMBODIMENTS

Figure 1:
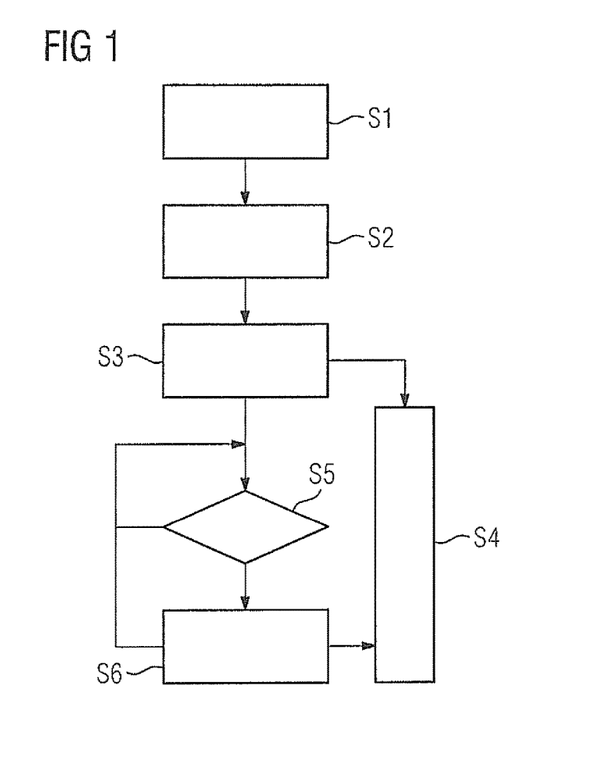
FIG. 1 is a flowchart of an exemplary embodiment of the inventive method.

FIG. 1 explains a general exemplary embodiment of the inventive method. The inventive method serves to record calibration data, from which convolution kernels for the later use of an inplane GRAPPA algorithm and a slice GRAPPA algorithm are to be calculated. The convolution kernels are then used in order to derive magnetic resonance data from measurement data of a patient. The measurement data is recorded in this case in echo planar imaging, wherein a number of slices are recorded simultaneously (Simultaneous Multislice SMS). A recording region of the patient is recorded; diffusion imaging can be involved for example.

The calibration data are recorded in a reference scan preceding the measurement of the diagnostic measurement data and, if possible, this is to be done so that the scans are influenced as little as possible by movements in the recording region, so physiological processes have as little influence as possible, and the phase encoding bandwidth matches that used during the recording of the measurement data as closely as possible.

To accomplish this, in a step S1, the measurement data recording (acquisition) parameters for the reference scan are established from the known recording parameters for the recording. These recording parameters in particular designate at least one segment to be recorded in one repetition of the amount of k-space to be sampled in the readout direction, wherein the segment describes a sub-region of the extent of the amount of k-space to be sampled in the readout direction and at least one of the at least one segment extends around the center of k-space in the readout direction. The recording parameters further designate a recording order for the various slices of the slice stack to be recorded, which will be discussed in greater detail below. An optional further recording parameter can designate the readout process for the calibration data is also restricted in the phase encoding direction, but in the remaining portion to be read out in the phase encoding direction, a complete sampling is performed, meaning that no k-space lines are left out. The fractional provided in this way also extends in this example symmetrically around the center of k-space, as is also possible for the at least one segment that contains the center of k-space. The method can also operate with techniques known as asymmetrical partial Fourier techniques, in which an asymmetrical sampling is explicitly used and/or missing data can be reconstructed as a result of a symmetry around the center of k-space.

The fact that only a part of k-space is sampled in the readout direction during a repetition allows shorter readout gradient pulses, and thus also shorter echo spacings, to be realized, so that the phase encoding bandwidth during the recording of the calibration data through this readout segmentation can be adapted to that used during the recording of the measurement data. The recording parameters are also determined accordingly.

Figure 2:
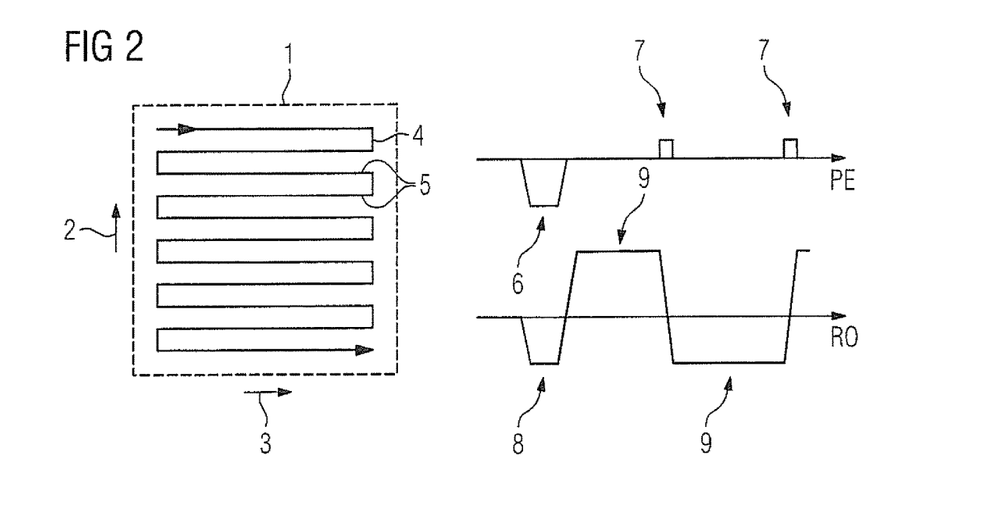
FIG. 2 shows a diagram of k-space to be sampled and gradients for complete sampling thereof.

This concept will be explained in greater detail using FIGS. 2 and 3. FIG. 2 shows (schematically) k-space 1 to be sampled, wherein the arrow 2 designates the phase encoding direction, the arrow 3 designates the readout direction. Also shown as an example is a k-space trajectory 4, which in the present example completely traverses k-space 1 to be sampled, meaning that each of the k-space lines 5 to be sampled is sampled over the entire length in the readout direction (arrow 3).

Shown to the left of this diagram are gradient pulses of the phase encoding gradients (PE) and of the readout gradients (RO) used for this. Through the gradient pulse 6, a setting to the first k-space row 5 to be read out in the phase encoding direction is allowed; the shorter gradient pulses 7 (often also referred to as "blips") jump between the individual k-space lines 5. For the readout gradients the initial position is first reached by a pulse 8, before magnetic resonance signals are read out during the plateaus of the following gradient pulses 9.

FIG. 3 shows, again as a schematic diagram, k-space 1 of FIG. 2 to be read out, which in FIG. 3 is divided in the readout direction (arrow 3) into three segments 10, 11 and 12, for which a k-space trajectory 13 is shown in each case as an example. The segment 11 in this case extends symmetrically around the center of k-space. Since, with the k-space trajectories 13, the entirety of k-space 1 does not have to be sampled in the readout direction (arrow 3), the corresponding gradient pulses 9' for reading-out are shorter, while a gradient pulse 8' is selected corresponding to a suitable starting point leading to the k-space trajectory is to be selected. For simplicity and as is usual in such schematic illustrations, all possible gradient pulses 8' for the different segments 10, 11, 12 have been shown.

Although the gradient pulses 9' are shown as trapezoidal in shape in the present example, it should be noted that sinusoidal gradient pulses 9' can be used as an alternative for example, but it should still be insured that the desired, correct phase encoding bandwidth is still produced.

Figure 3:
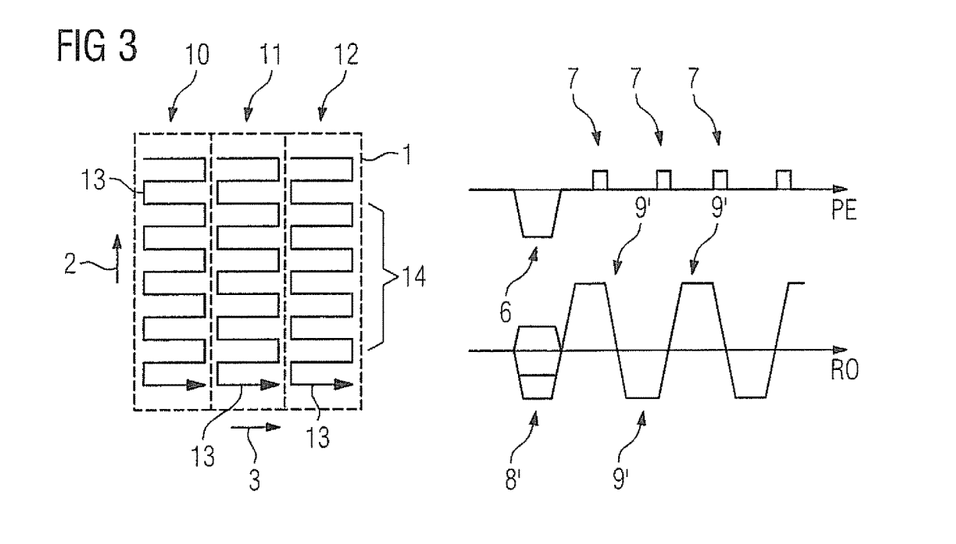
FIG. 3 shows a segmentation of k-space to be sampled in the readout direction, and gradient pulses for a measurement restricted to segments.

The example of FIG. 3 shows k-space trajectories 13, which cover all lines 5 in the k-space 1 in the phase encoding direction (arrow 2). It is also conceivable to reduce the number of k-space lines 5 to be read out, by causing the k-space trajectory 13 to extend only over a portion 14 in the phase encoding direction (arrow 2). In this way the recording time for the calibration data can be further shortened but the significant proportions around the center of the k-space are still read out.

Another point to note is that in the present example k-space 1 is divided in the readout direction (arrow 3) into three segments 10, 11, 12, which do not necessarily all have to be recorded in order to obtain sufficient calibration data. It is thus conceivable, for example, to sample only the segment 11 extending around the center of k-space in the readout direction, using the corresponding k-space trajectory 13. In this way, only a single repetition is necessary for each slice of the slice stack to record the calibration data, in order to record all the calibration data that are needed. With gradient echo EPI, however, it can be expedient, in order to be able to take account of displacements caused by B0-inhomogenities, also to record a number of adjacent segments in the readout direction, here for example segments 10 and 12. Other possibilities also exist for addressing the displacements resulting from the B0 inhomogeneities.

It should also be again noted that the diagram in FIG. 3 is only schematic. This means that usually the k-space trajectories will actually fully cover the segments 10, 11, 12, since the spacing shown is only for improved clarity. It is also conceivable to define the segments 10, 11, 12 with a specific overlapping area, so that parts of k-space 1 are sampled by a multiple k-space trajectories 13. These overlapping areas are to be kept small however.

In a step S2, the established recording parameters are then used to record calibration data for all slices, before, in a step S3 the deconvolution kernels for the GRAPPA algorithms are established. In a step S4, the measurement data are recorded with undersampling within the slices and using simultaneous multislice imaging.

Figure 4:
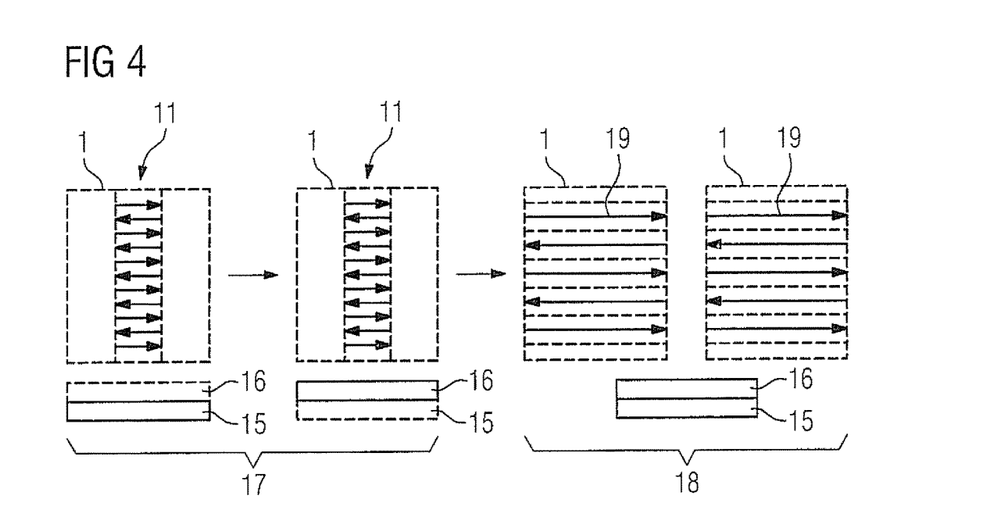
FIG. 4 shows a simple example of an execution sequence to explain the method.

FIG. 4 explains this in greater detail, in a simple example of only two slices 15, 16 of a slice stack. During the reference scan 17, first the central segment 11 of k-space 1 is acquired for the slice 15 within one repetition. In the next repetition, this same measurement of the segment 11 is carried out for slice 16. Thus the calibration data are already recorded and the actual measurement process 18 follows, in which measurement data for both slices 15, 16 are recorded simultaneously using the same k-space trajectories 19, with undersampling. This means that every other k-space row 5 is not covered by the k-space trajectory 19 (filling and not filling of k-space rows in alternation).

Due to the calibration data, however, convolution kernels can be determined for the GRAPPA algorithms, so that, from the overlaid measurement data initially by a slice GRAPPA algorithm, the magnetic resonance data for the individual slices 15, 16 can be extracted. After which, by use of an inplane GRAPPA algorithm, the magnetic resonance data to be assigned to non-sampled k-space lines 5 can be determined.

Figure 5:
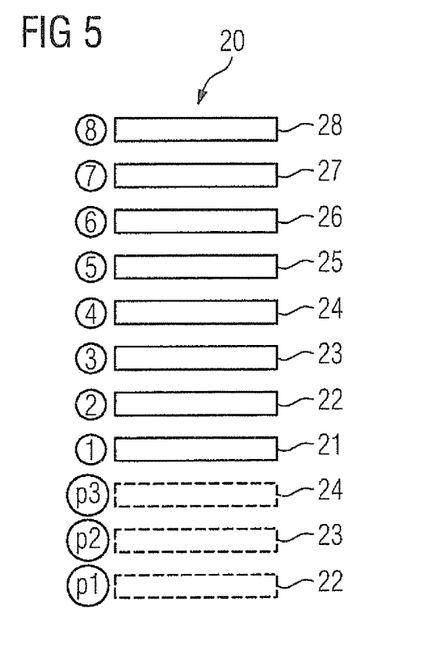
FIG. 5 shows a first embodiment for the slice order.
Figure 6:
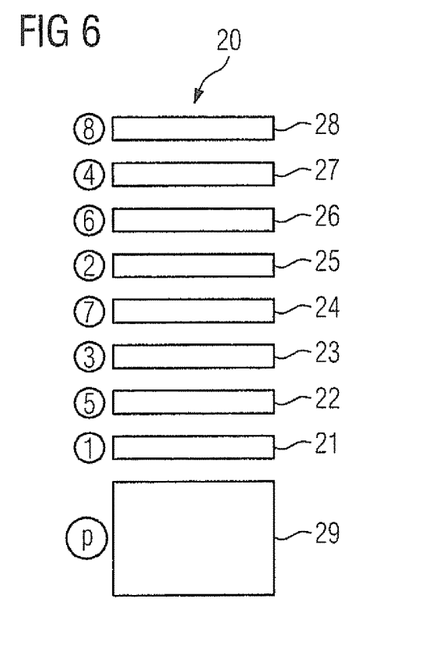
FIG. 6 shows a second embodiment for the slice order.

Usually a slice stack, which covers the desired recording region, will include more than two slices 15, 16, so that a degree of freedom exists in the choice of the slice order during the recording of the calibration data. Two variants for selection of the slice order as recording parameters in step S1 are shown by FIGS. 5 and 6.

In these figures a slice stack 20 with eight slices 21 to 28 is shown. The numbers in circles to the left of the slices 21 to 28 in this case indicate their position in the slice order for recording. It can be seen that in the case of FIG. 5, the slice stack is begun with lowest slice 21, after which the following slices are always sampled, thus slice 22 as the second slice, then the slice 23, then the slice 24, then the slice 25, then the slice 26, then the slice 27 and finally the slice 28. In order to establish a defined steady state for all slices 21 to 28 to be recorded, the neighboring slices 22, 23 and 24 to the first slice 21 to be recorded, designated p1, p2 and p3, will already have been sampled with preliminary measurements, but the preliminary data will be discarded.

A preferred second embodiment is shown in FIG. 6, which again shows the slice stack 20 with the slices 21 to 28, but other recording orders are produced here. This is because, in the subsequent SMS imaging for recording the measurement data, the slices 21 and 25, the slices 23 and 27, the slices 22 and 26, and also the slices 24 and 28 are to be recorded simultaneously. Accordingly, the recording order has been selected so that its calibration data will be recorded directly consecutively in time, thus in repetitions immediately following each another. Accordingly, the recording order provides for the slice 21 to be recorded first, then the slice 25, then the slice 23, then the slice 27, then the slice 22, then the slice 26, then the slice 24 and then the slice 28.

In order to insure a fixed steady state here for the recording of the calibration data of the various slices 21 to 28, a preliminary scan indicated by the block 29, relating to the entire slice stack 20, is carried out, and the preliminary data will again be discarded.

Returning to FIG. 1, continuous monitoring in a step S5 can optionally take place during the measurement process 18 in step S4, as to whether a recalibration criterion is fulfilled. The recalibration criterion here evaluates movement data describing the movement of the patient in the recording region. If the movement is too large, in a step S6 there can be a repetition the recording of the calibration data from step S2, and calculation of updated deconvolution kernels according to step S3, which are applied accordingly to the measurement data recorded after this point in time.

Figure 7:
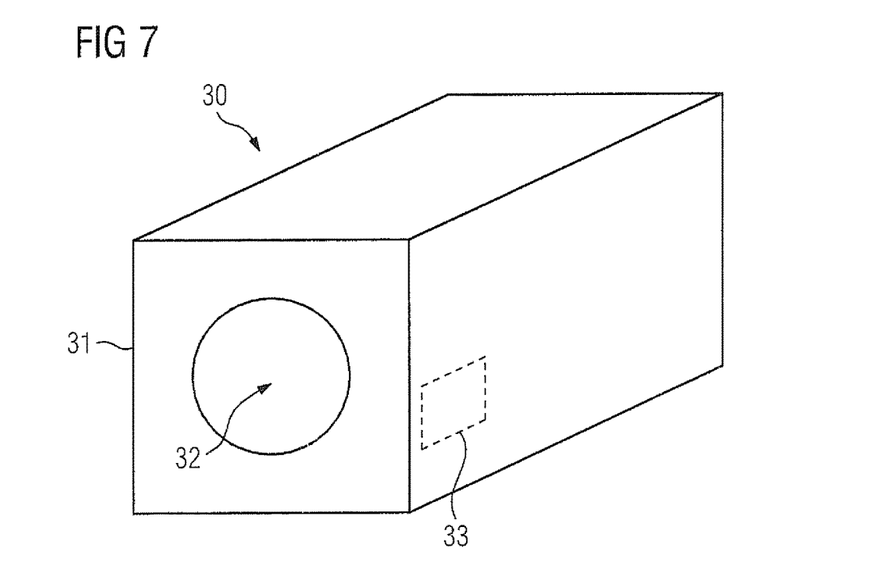
FIG. 7 schematically illustrates an inventive magnetic resonance device.

FIG. 7 shows a greatly simplified basic diagram of an inventive magnetic resonance apparatus 30, which, as is known, has a scanner 31, with superconducting magnets that produce the basic field (B0 field). The scanner has a patient receiving area 32, which is surrounded by a radio-frequency coil arrangement and a gradient coil arrangement (not shown). The patient can be moved into the patient receiving area 32 by an appropriate patient bed.

The operation of the magnetic resonance apparatus 30 is controlled by a control computer 33, which is configured to operate the scanner 31 in order to implement the inventive method. The control computer 33 can have a recording parameter establishment processor for carrying out step S1 and a sequence controller for carrying out step S2. An evaluation processor for the calibration data to establish the deconvolution kernels for the GRAPPA algorithms can also be present, and optionally a monitoring processor for monitoring the fulfillment of the recalibration criterion.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring calibration data for establishing convolution kernels for GeneRalized Autocalibrating Partial Parallel Acquisition (GRAPPA) algorithms for reconstruction of image data from magnetic resonance (MR) measurement data, said method comprising:

operating an MR data acquisition scanner to acquire MR measurement data by executing an echo planar MR imaging sequence with simultaneous acquisition of MR data, during echo train comprising a plurality of echoes with an echo spacing ES between successive echoes from a plurality of slices in a slice stack, with phase encoding of the measurement data;

operating said MR data acquisition scanner to acquire a set of calibration data, also with phase encoding, in a predetermined slice order of said slices in said slice stack and entering the acquired calibration data into lines in k-space by, for each slice, sampling at least one segment of k-space in a readout direction for completely sampled readout in a phase coding direction of said phase encoding, with at least one segment of k-space extending around a center of k-space in the readout direction, and selecting a segment width of each segment in k-space to comprise N k-space lines so as to cause a phase encoding bandwidth, which is 1/N·ES, in said set of calibration data to match the phase encoding bandwidth in the acquisition of the MR measurement data, and thereby causing said set of calibration data to be usable both for reconstruction of image data from said MR measurement data using a slice GRAPPA algorithm and for reconstruction of image data from said MR measurement data using an inplane GRAPPA algorithm;

in a processor, calculating a convolution kernel from said set of calibration data for each of said reconstruction using said slice GRAPPA algorithm and said reconstruction using said inplane GRAPPA algorithm; and making the calculated convolution kernels available in electronic form as a data file formatted for use in each of said reconstruction using said slice GRAPPA algorithm and said reconstruction using said inplane GRAPPA algorithm.

2. A method as claimed in claim 1 comprising selecting said slice order as spatially consecutive slices of said slice stack, starting at one side of said slice stack.

3. A method as claimed in claim 2 comprising, before acquiring said calibration data from a first of said slices, acquiring preliminary data from at least two neighboring slices that neighbor said first of said slices, and thereby producing a steady state of nuclear spins in said first of said slices, and thereafter discarding said preliminary data.

4. A method as claimed in claim 1 comprising selecting said slice order so that all slices from which MR data are acquired simultaneously are ordered in groups with acquisition of said MR data taking place with said groups sequentially following each other.

5. A method as claimed in claim 4 comprising establishing a steady state of nuclear spins in said slice stack by, before acquiring said calibration data from a first of said groups, uploading said MR scanner to acquire preliminary scan data from an entirety of said slice stack, and thereafter discarding said preliminary scan data.

6. A method as claimed in claim 1 comprising operating said MR scanner to activate a trapezoidal or a sinusoidal readout gradient pulse during which said calibration data are acquired.

7. A method as claimed in claim 1 comprising, in said phase encoding direction, sampling only a fractional portion of k-space within said segment that extends around the center of k-space.

8. A method as claimed in claim 1 comprising using a gradient echo sequence as said echo planar imaging sequence, and acquiring calibration data for at least two neighboring segments of said segment that surrounds the center of k-space in the readout direction.

9. A method as claimed in claim 1 comprising monitoring acquisition of said calibration data with respect to a recalibration criterion that is based on movement of a subject from which said calibration data are acquired and, if said recalibration criterion is fulfilled during acquisition of said MR measurement data, acquiring new calibration data and updating said convolution kernels.

10. A magnetic resonance (MR) apparatus comprising:
an MR data acquisition scanner;
a computer configured to operate said MR data acquisition scanner to acquire MR measurement data by executing an echo planar MR imaging sequence with simultaneous acquisition of MR data, during echo train comprising a plurality of echoes with an echo spacing ES between successive echoes from a plurality of slices in a slice stack, with phase encoding of the MR measurement data;
said computer being configured to operate said MR data acquisition scanner to acquire a set of calibration data, also with phase encoding, in a predetermined slice order of said slices in said slice stack and to enter the acquired calibration data into lines in k-space by, for each slice, sampling at least one segment of k-space in a readout direction for completely sampled readout in a phase coding direction of said phase encoding, with at least one segment of k-space extending around a center of k-space in the readout direction, and selecting a segment width of each segment in k-space to comprise N k-space lines so as to cause a phase encoding bandwidth, which is 1/N·ES, in said set of calibration data to match the phase encoding bandwidth in the acquisition of the MR measurement data, and thereby causing said set of calibration data to be usable both for reconstruction of image data from said MR measurement data using a slice GRAPPA algorithm and for reconstruction of image data from said MR measurement data using an inplane GRAPPA algorithm;
said processor being configured to calculate a convolution kernel from said calibration data for each of said reconstruction using said slice GRAPPA algorithm and said reconstruction using said inplane GRAPPA algorithm; and
said processor being configured to make the calculated convolution kernels in electronic form as a data file formatted for use in each of said reconstruction using said slice GRAPPA algorithm and said reconstruction using said inplane GRAPPA algorithm.

11. A non-transitory, computer-readable data storage medium encoded with programming instructions, said storage medium being loaded into a computer system of a magnetic resonance (MR) apparatus that comprises an MR data acquisition scanner, said programming instructions causing said computer system to:
operate said MR data acquisition scanner to acquire a set of MR measurement data by executing an echo planar MR imaging sequence with simultaneous acquisition of MR data, during echo train comprising a plurality of echoes with an echo spacing ES between successive echoes from a plurality of slices in a slice stack, with phase encoding of the MR measurement data;
operate said MR data acquisition scanner to acquire calibration data, also with phase encoding, in a predetermined slice order of said slices in said slice stack and to enter the acquired calibration data into lines in k-space by, for each slice, sampling at least one segment of k-space in a readout direction for completely sampled readout in a phase coding direction of said phase encoding, with at least one segment of k-space extending around a center of k-space in the readout direction, and selecting a segment width of each segment in k-space to comprise N k-space lines so as to cause a phase encoding bandwidth, which is 1/N·ES, in said set of calibration data to match the phase encoding bandwidth in the acquisition of the MR measurement data, and thereby causing said set of calibration data to be usable both for reconstruction of image data from said MR measurement data using a slice GRAPPA algorithm and for reconstruction of image data from said MR measurement data using an inplane GRAPPA algorithm;
calculate a convolution kernel from said set of calibration data for each of said reconstruction using said slice GRAPPA algorithm and said reconstruction using said inplane GRAPPA algorithm; and
make the calculated convolution kernels available in electronic form as a data file formatted for use in each of said reconstruction using said slice GRAPPA algorithm and said reconstruction using said inplane GRAPPA algorithm.

* * * * *